United States Patent
Casper et al.

(10) Patent No.: US 6,614,301 B2
(45) Date of Patent: Sep. 2, 2003

(54) DIFFERENTIAL AMPLIFIER OFFSET ADJUSTMENT

(75) Inventors: Bryan K. Casper, Hillsboro, OR (US); James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/062,625

(22) Filed: Jan. 31, 2002

(65) Prior Publication Data

US 2003/0141929 A1 Jul. 31, 2003

(51) Int. Cl.[7] .................................................. H03F 3/45
(52) U.S. Cl. ........................ 330/253; 330/259; 330/261; 327/307
(58) Field of Search ................................. 330/253, 259, 330/261, 252; 327/307

(56) References Cited

U.S. PATENT DOCUMENTS

| | | | |
|---|---|---|---|
| 4,622,521 A | * 11/1986 | Redfern | 330/9 |
| 6,218,892 B1 | * 4/2001 | Soumyanath et al. | 327/537 |
| 6,261,879 B1 | * 7/2001 | Houston et al. | 438/154 |
| 6,362,687 B2 | * 3/2002 | Cox | 330/253 |

* cited by examiner

Primary Examiner—Henry Choe
(74) Attorney, Agent, or Firm—Schwegman, Lundberg, Woessner & Kluth, P.A.

(57) ABSTRACT

A differential amplifier includes a source coupled differential pair of transistors. A feedback loop detects the presence of an input referred offset in the differential amplifier and modifies a body bias voltage on at least one of the transistors in the differential pair. A comparator detects a differential output voltage when the differential input voltage is set to zero. In some embodiments, a charge pump in the feedback loop injects charge on the body of the transistor to modify the bias voltage. In other embodiments, a digital-to-analog converter receives a digital control word and produces a bias voltage on the body of the transistor.

23 Claims, 7 Drawing Sheets

US 6,614,301 B2

DIFFERENTIAL AMPLIFIER OFFSET ADJUSTMENT

FIELD

The present invention relates generally to amplifiers, and more specifically to amplifiers with adjustable offsets.

BACKGROUND

Amplifiers are used for many purposes. Amplifiers receive input signals, amplify them, and produce output signals with a larger amplitude. Some amplifiers suffer from an "input referred offset." An amplifier with an input referred offset produces a non-zero output signal when a zero input signal is received. This can be a problem, in part because amplifiers with very high gain can produce large output signals with a zero input signal.

Prior art systems have reduced input referred offset in various ways. One typical mechanism to reduce input referred offset includes the use of circuit layout techniques to match the performance of source-coupled transistors in differential amplifiers. See, for example, section 24.1.4 of R. Jacob Baker et. al, "CMOS Circuit Design, Layout, and Simulation," IEEE Press, 1998. Known circuit layout techniques, such as those discussed in the Baker reference, can reduce input referred offset, but fall short of eliminating it completely.

For the reasons stated above, and for other reasons stated below which will become apparent to those skilled in the art upon reading and understanding the present specification, there is a need in the art for methods and apparatus to further reduce input referred offsets in amplifiers.

DESCRIPTION OF EMBODIMENTS

Figure 1:
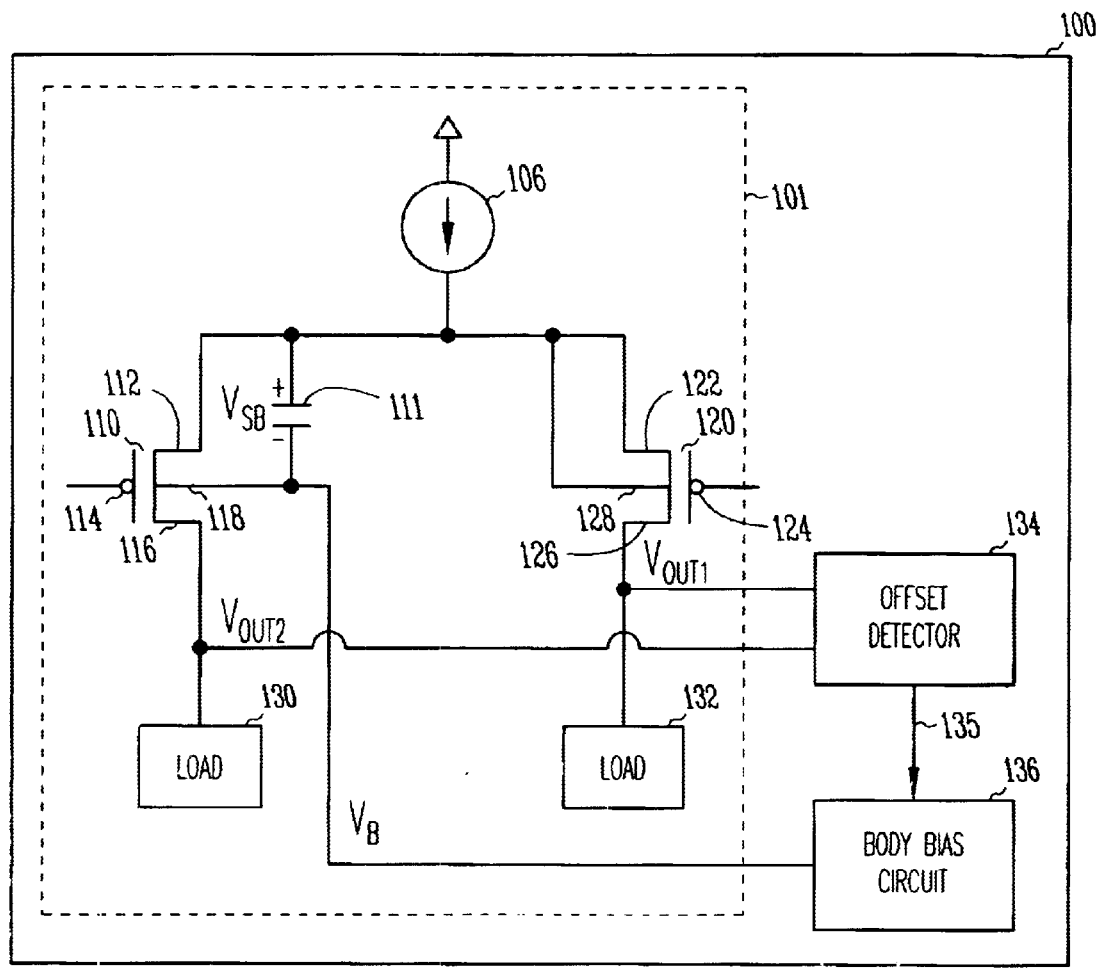
FIG. 1 shows an integrated circuit with amplifier offset adjustment.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to reduce input referred offsets in amplifiers. In some embodiments, a differential pair of transistors is provided, one or more of which having an adjustable body bias. The body bias can be adjusted in many different ways. In some embodiments, a charge pump and control circuit are used to modify the body bias. In other embodiments, a digital-to-analog converter and processor are used to modify the body bias. By adjusting the body bias of one or more transistors in a differential pair of transistors, the input referred offset can be reduced.

FIG. 1 shows an integrated circuit with amplifier offset adjustment. Integrated circuit 100 includes amplifier 101, offset detector 134, and body bias circuit 136. Amplifier 101 includes current source 126, load devices 130 and 132, and transistors 110 and 120 configured as a differential pair of transistors. In some embodiments, amplifier 101 is an input stage of a larger amplifier circuit. For example, in some embodiments, amplifier 101 is the input stage of an operational amplifier (op-amp).

Transistor 120 has source 122, gate 124, drain 126, and body 128. Body 128 is coupled to source 122 which is also coupled to current source 126. As a result, source 122 and body 128 are at the same potential, and the source-to-body voltage is zero. Transistor 110 has source 112, gate 114, drain 116, and body 118. Body 118 is coupled to source 112 through capacitor 111. Because capacitor 111 is coupled between the source and body of transistor 110, a non-zero source-to-body voltage ($V_{SB}$) can be applied to transistor 110.

Load device 130 is coupled to drain 116 of transistor 110, and load device 132 is coupled to drain 126 of transistor 120. Currents from transistors 120 and 110 conduct through load devices 132 and 130, producing voltages $V_{OUT1}$ and $V_{OUT2}$, respectively. In some embodiments, load devices 130 and 132 are resistive load devices, and in other embodiments, load devices 130 and 132 are active load devices. Any type of load device can be utilized for load devices 130 and 132 without departing from the scope of the present invention.

A control loop is formed by the combination of amplifier 101, offset detector 134, and body bias circuit 136. Offset detector 134 includes two input terminals; one coupled to each of drains 126 and 116 to receive $V_{OUT1}$ and $V_{OUT2}$, respectively. Offset detector 134 also includes an output coupled to node 135. Body bias circuit includes an input coupled to node 135 and an output coupled to body 118, thereby closing the loop.

In embodiments represented by FIG. 1, transistors 110 and 120 are p-channel metal oxide semiconductor field effect transistors (PMOSFETs). In other embodiments, other types of transistors are used. For example, in some embodiments, junction field effect transistors (JFET) are used, and in other embodiments, bipolar junction transistors (BJT) are used. As used herein, the term "p-channel transistor" refers to any transistor having an p-doped channel.

In some embodiments, offset detector 134 detects a voltage offset between the two halves of the differential pair. As shown in FIG. 1, source-to-drain currents in transistors 110 and 120 conduct into load devices 130 and 132, producing voltages at the input terminals to offset detector 134. If the voltages across load devices 130 and 132 are not substantially equal when gates 114 and 124 are at substantially the same potential, then offset detector 134 detects a voltage offset. In detecting a voltage offset, offset detector 134 is detecting that the source-to-drain currents of transistors 110 and 120 are not equal.

In other embodiments, offset detector 134 detects a current offset directly. In some of these embodiments, load devices 130 and 132 are omitted, and offset detector 134 serves the dual purpose of providing a load and providing offset detection. In these embodiments, offset detector 134 receives the source-to-drain currents of transistors 110 and 120, and detects an offset by comparing the currents.

In operation, offset detector 134 detects whether an offset exists in amplifier 101, and notifies body bias circuit 136 on node 135. Body bias circuit 136, in response to offset detector 134, provides a body bias voltage ($V_B$) to body 118, which has an influence on $V_{SB}$ of transistor 110. As the $V_{SB}$ of a transistor changes, so does the threshold voltage. This is referred to as the "body effect." As the threshold voltage of transistor 110 changes relative to the threshold voltage of transistor 120, the offset of amplifier 101 also changes. For a more in-depth discussion of the body effect of MOS transistors, see section 4.1.2.6 of William J. Dally and John W. Poulton, "Digital Systems Engineering," Cambridge University Press, 1998.

Figure 2:
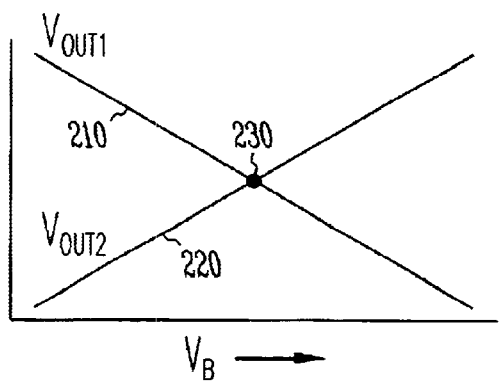
FIG. 2 shows a graph of output voltages as a function of a body bias voltage.

In some embodiments, the control loop shown in FIG. 1 performs a method to reduce the offset in amplifier 101. Body bias circuit 136 sweeps $V_B$ across a range of values and determines a desirable body bias voltage for transistor 110. Referring now to FIG. 2, $V_{OUT1}$ and $V_{OUT2}$ are shown as curves 210 and 220, respectively. Curves 210 and 220 show $V_{OUT1}$ and $V_{OUT2}$ as a function of $V_B$ of transistor 110. As $V_B$ of transistor 110 is increased, $V_{SB}$ decreases, and the threshold voltage of transistor 110 also decreases. For any given input voltage, transistor 110 conducts more current source-to-drain, and $V_{OUT2}$ increases. Because transistor 110 conducts a larger share of the current provided by current source 106, transistor 120 conducts less current source-to-drain, and $V_{OUT1}$ decreases.

Point 230 shows a bias point at which $V_{OUT1}$ and $V_{OUT2}$ are substantially equal. As body bias circuit 136 sweeps the body bias voltage of transistor 110 past point 230, offset detector 134 reports that $V_{OUT2}$ has exceeded $V_{OUT1}$. In some embodiments, node 135 is a single line, such as the output of a comparator. In these embodiments, body bias circuit 136 receives an indication that point 230 has been passed when a signal on node 135 changes state. In other embodiments, node 135 includes more than one conductor that include signals representing a digital value. In these embodiments, body bias circuit 136 receives an indication that point 230 has been passed when the signal on node 135 changes sign.

Figure 3:
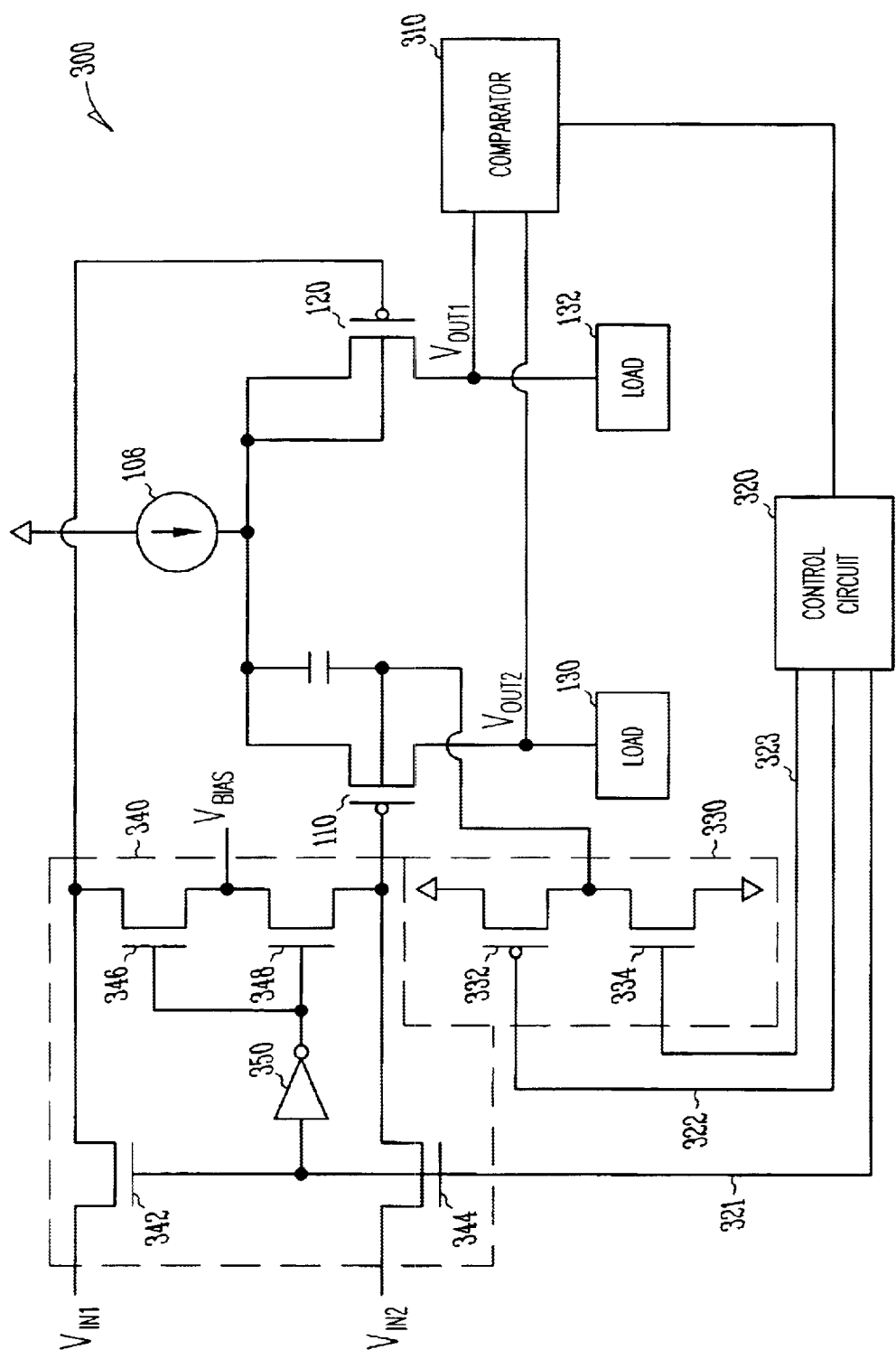
FIG. 3 shows an amplifier circuit with a charge pump.

FIG. 3 shows an amplifier circuit with a charge pump. Circuit 300 includes transistors 110 and 120, load devices 130 and 132, capacitor 111, and current source 106. Circuit 300 also includes comparator 310, control circuit 320, charge pump 330, and input select circuit 340. Comparator 310, control circuit 320, and charge pump 330 form a feedback loop that, in some embodiments, performs the functions of offset detector 134, and body bias circuit 136 (FIG. 1).

Input select circuit 340 includes select transistors 342, 344, 346, and 348, and inverter 350. Control circuit 320 controls input select circuit 340 by asserting a control signal on node 321. When the control signal on node 321 is high, select transistors 342 and 344 are on, select transistors 346 and 348 are off, and the amplifier is in normal operation. When in normal operation, input voltages $V_{IN1}$ and $V_{IN2}$ are passed through input select circuit 340 to the gates of transistors 110 and 120. When the control signal on node 321 is low, select transistors 342 and 344 are off, select transistors 346 and 348 are on, and the amplifier is in "offset adjust mode." When in offset adjust mode, the gates of transistors 110 are 120 are set to a common potential ($V_{BIAS}$).

Charge pump 330 includes p-channel transistor 332 and n-channel transistor 334 coupled in series drain-to-source. Transistor 332 is controlled by a signal on node 322, and transistor 334 is controlled by a control signal on node 323. Both signals on nodes 322 and 323 are controlled by control circuit 320. When control circuit 320 provides a negative going pulse on node 322, transistor 332 turns on and injects positive charge onto the body of transistor 110. When control circuit 320 provides a positive going pulse on node 323, transistor 334 turns on and removes positive charge from the body of transistor 110. By controlling the number and duration of pulses on nodes 322 and 323, control circuit 320 can control the amount of charge on the body of transistor 110.

As shown in FIG. 3, transistors 342, 344, 346, 348, and 334 are n-channel metal oxide semiconductor field effect transistors (NMOSFETs). In other embodiments, other types of transistors are used. For example, in some embodiments, junction field effect transistors (JFET) are used, and in other embodiments, bipolar junction transistors (BJT) are used. As used herein, the term "n-channel transistor" refers to any transistor having an n-doped channel.

In operation, control circuit 320 causes circuit 300 to enter offset adjust mode, senses the output of comparator 310, and adjusts the charge on the body of transistor 110 by controlling charge pump 330. In some embodiments, control circuit 320 first asserts the control signal on node 323 for a sufficient period of time to drain all the positive charge from the body of transistor 110. Control circuit 320 then senses the comparator output on node 311, and increases the charge on the body of transistor 110 until the comparator output changes state. This corresponds to point 230 shown in FIG. 2. In other embodiments, control circuit 320 first asserts the control signal on node 322 for a sufficient period of time to set the body bias of transistor 110 as high as possible. Control circuit 320 then decreases the body bias until point 230 (FIG. 2) is approached from the opposite direction.

Control circuit 320 can be any type of control circuit capable of being responsive to comparator 310 and capable of controlling input select circuit 340 and charge pump 330. For example, in some embodiments, control circuit 320 is a finite state machine. In other embodiments, control circuit 320 is a dedicated processor that executes instructions from a control store. In still other embodiments, control circuit 320 is a microprocessor that receives information from comparator 310 and drives signals on nodes 321–323.

Figure 4:
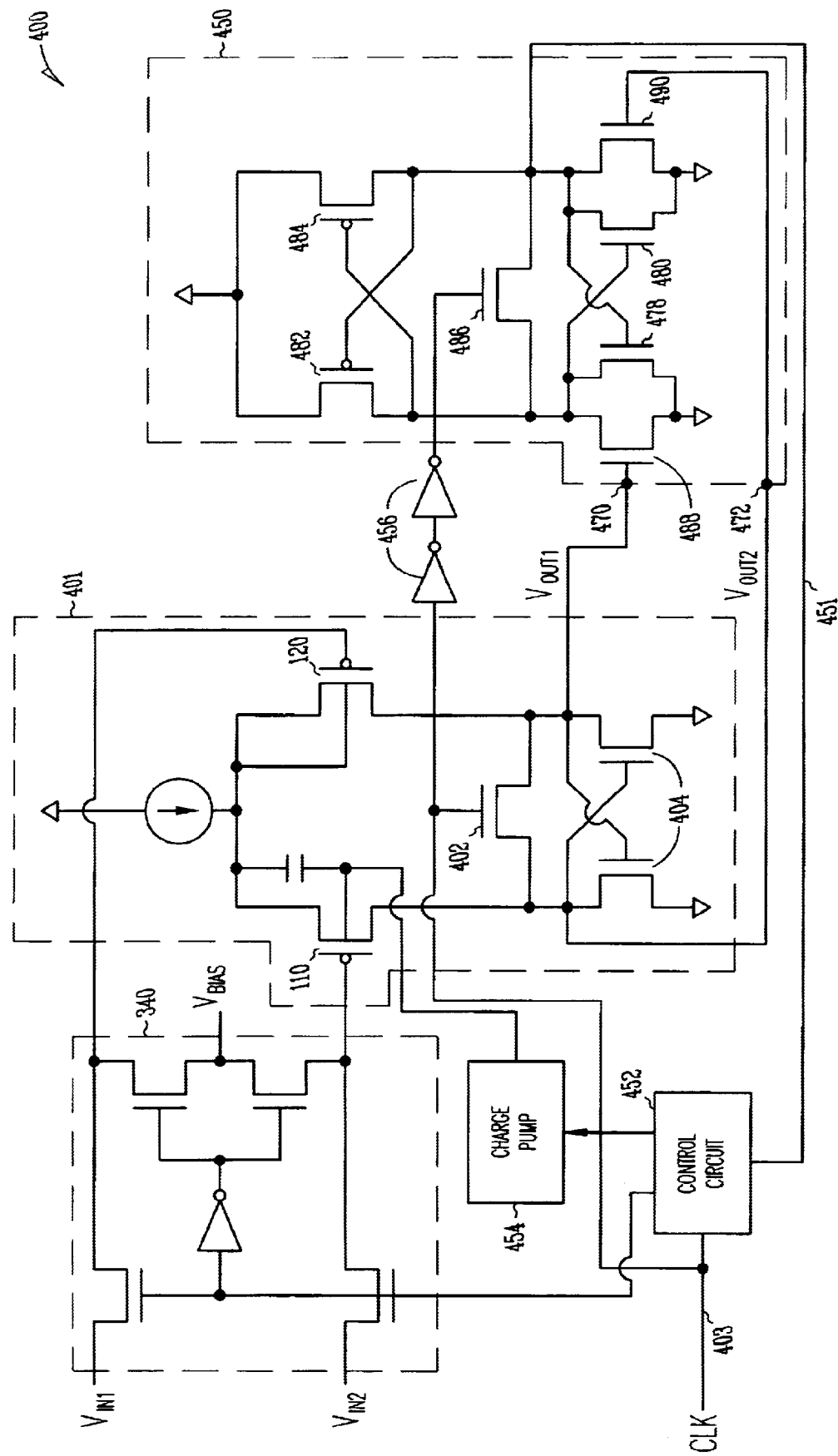
FIG. 4 shows a clocked amplifier and comparator with amplifier offset adjustment.

FIG. 4 shows a clocked amplifier and comparator with amplifier offset adjustment. Circuit 400 includes clocked amplifier 401, clocked comparator 450, input select circuit 340, control circuit 452, and charge pump 454. Clocked amplifier 401 includes differential pair of transistors 110 and 120, switched transistor 402, and load transistors 404.

Clocked comparator 450 includes a pair of input nodes 470 and 472, output node 451, a pair of cross-coupled n-channel transistors 478 and 480, a pair of cross-coupled p-channel transistors 482 and 484, n-channel switched transistor 486, and an input pair of n-channel transistors 488 and 490. Input transistors 488 and 490 are coupled to input nodes 470 and 472. Input transistor 488 is connected in parallel with transistor 478, and input transistor 490 is connected in parallel with transistor 480.

In operation, control circuit 452 causes amplifier 401 to enter offset adjust mode as described above with reference to FIG. 3, and then modifies the body bias of transistor 110 once for each clock cycle of the clock signal (CLK) on node 403. When the CLK signal is at a steady-state high level, switched transistors 402 and 486 are both closed. With switched transistor 402 closed, the output nodes of clocked amplifier 401 are forced to be at substantially the same potential. When the CLK signal transitions from a high level to a low level, switched transistor 402 opens and $V_{OUT1}$ and $V_{OUT2}$ are allowed to vary as a function of any offset that exists in the differential pair of transistors.

Inverters 456 delay the clock signal on node 403 and apply it to switched transistor 486. When switched transistor 486 opens, clocked comparator 450 evaluates the difference between $V_{OUT1}$ and $V_{OUT2}$, and provides an offset indication on node 451. Control circuit 452 receives the offset indication on node 451 and commands charge pump 454 to increase or decrease the body bias on transistor 110 as described with reference to the previous figures.

In some embodiments, circuit 400 enters offset adjust mode periodically to adjust the offset of amplifier 401. For example, in some embodiments, circuit 400 adjusts the offset of amplifier 401 as the temperature changes to remove offsets that occur because of differences in temperature dependent circuit behavior. In other embodiments, circuit 400 enters offset adjust mode at periodic intervals to ensure that the offset of amplifier 401 cannot vary un-adjusted longer than a specified time interval.

Figure 5:
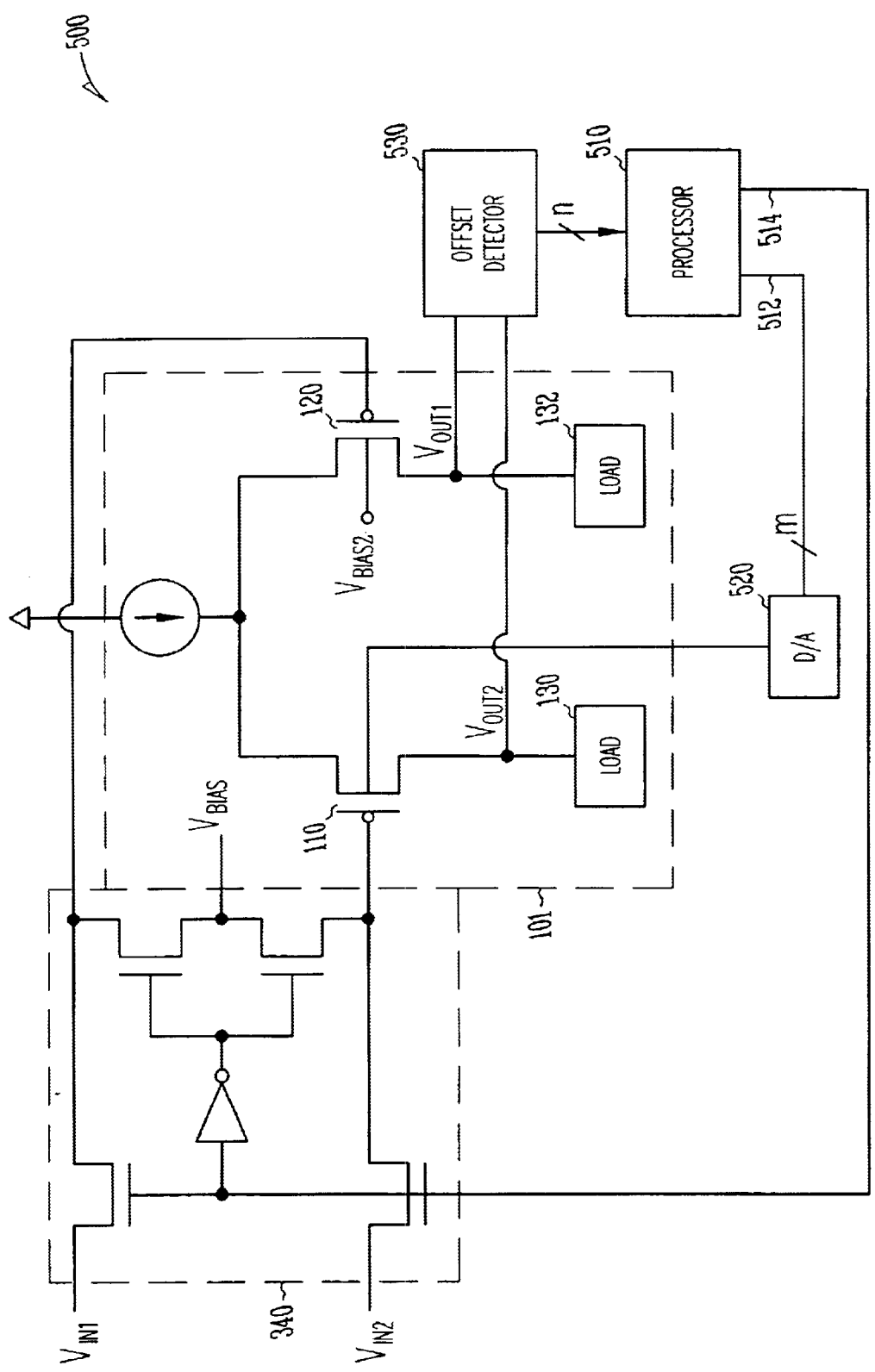
FIG. 5 shows an amplifier circuit with a digital-to-analog converter.

FIG. 5 shows an amplifier circuit with a digital-to-analog converter. Circuit 500 includes amplifier 101, input select circuit 340, offset detector 530, processor 510, and digital-to-analog (D/A) converter 520. Offset detector 530 receives $V_{OUT1}$ and $V_{OUT2}$, and produces an output signal on node 531. Node 531 is shown in FIG. 5 as "n" bits wide. In some embodiments, "n" is equal to one. In some of these embodiments, offset detector 530 is a comparator such as comparator 310 (FIG. 3) or clocked comparator 450 (FIG. 4). In other embodiments, "n" is larger than one. In some embodiments with "n" larger than one, offset detector 530 includes an analog-to-digital converter to provide processor 510 with an indication of the amount of offset between $V_{OUT1}$ and $V_{OUT2}$.

In embodiments represented by FIG. 5, the body bias of transistor 110 is controlled by D/A 520, and the body bias of transistor 120 is set to a value $V_{BIAS2}$. D/A 520 receives a digital control word of "m" bits on node 512 from processor 510. D/A 520 produces a body bias voltage for transistor 110 responsive to the "m" bit control word on node 512. $V_{BIAS2}$ provides a stable voltage to the body of transistor 120, and D/A 520 provides a voltage to the body of transistor 110 that differs a substantially constant amount from $V_{BIAS2}$. In other embodiments, $V_{BIAS2}$ is omitted, and D/A 520 is a dual output D/A that controls the body bias of both transistors 110 and 120. D/A 520 can be referenced to any potential, including the positive or negative power supply potentials, or any potential in between.

Processor 510 can be any type of processor capable of receiving an offset indication on node 531 and providing a digital control word to D/A 520. Examples include but are not limited to, a microprocessor, a digital signal processor, a microcontroller, or the like. In some embodiments, processor 510 is included within the same integrated circuit as the rest of circuit 500, and in other embodiments, processor 510 is in a separate integrated circuit.

In embodiments represented by FIG. 5, processor 510 can estimate the amount of offset that exists in amplifier 101, and change the digital control word on node 512 by an amount greater than one. This can reduce the amount of time required for circuit 500 to be in offset adjust mode.

Various embodiments have been described that have differential pairs of p-channel transistors. Other embodiments exist that have differential pairs of n-channel transistors. Any differential pair of transistors with body biasing that reduces input referred offsets is intended to be within the scope of the present invention.

Figure 6:
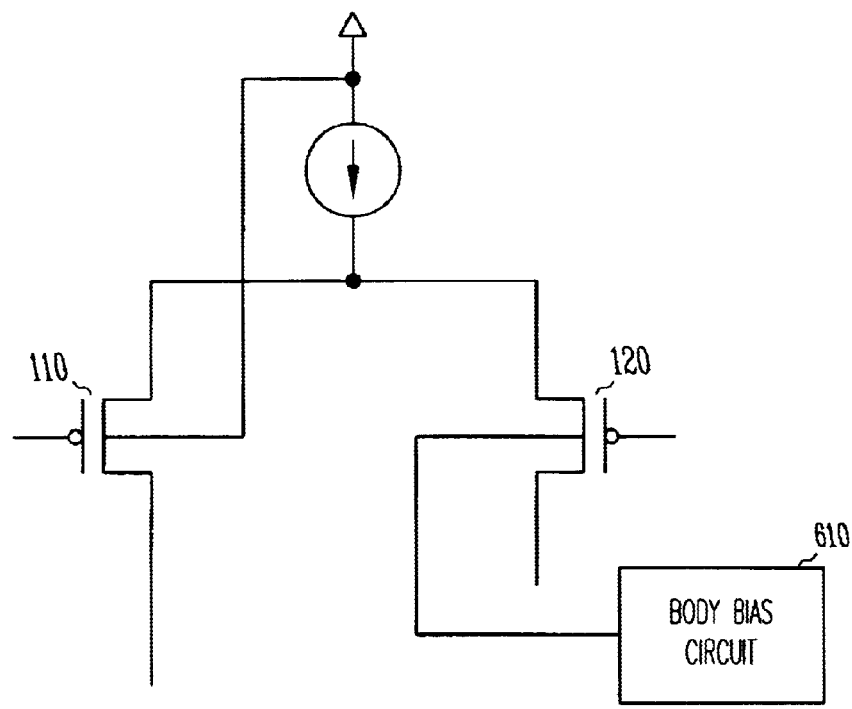
FIGS. 6–8 show portions of amplifier circuits with various body bias circuits.
Figure 7:
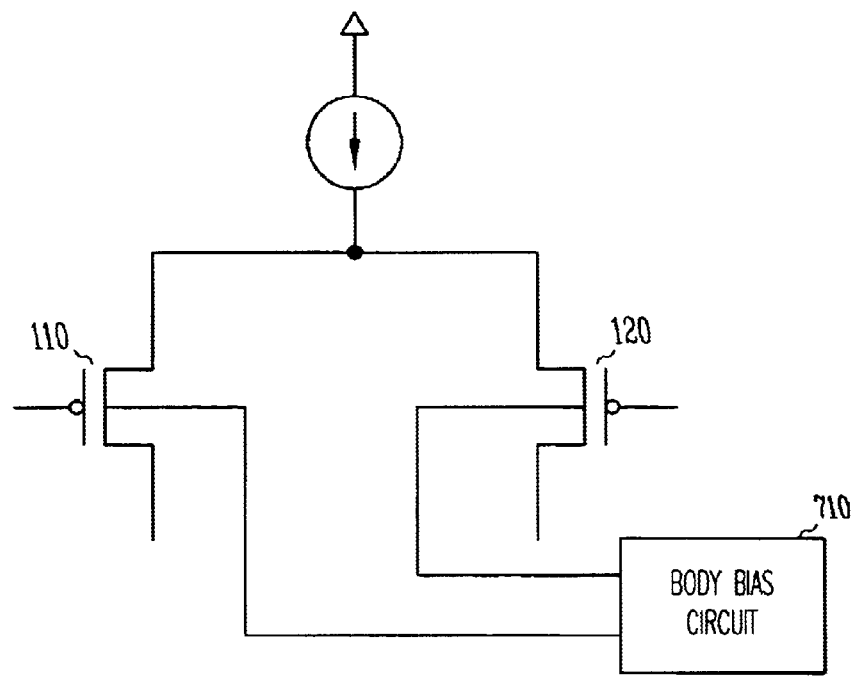
Figure 8:
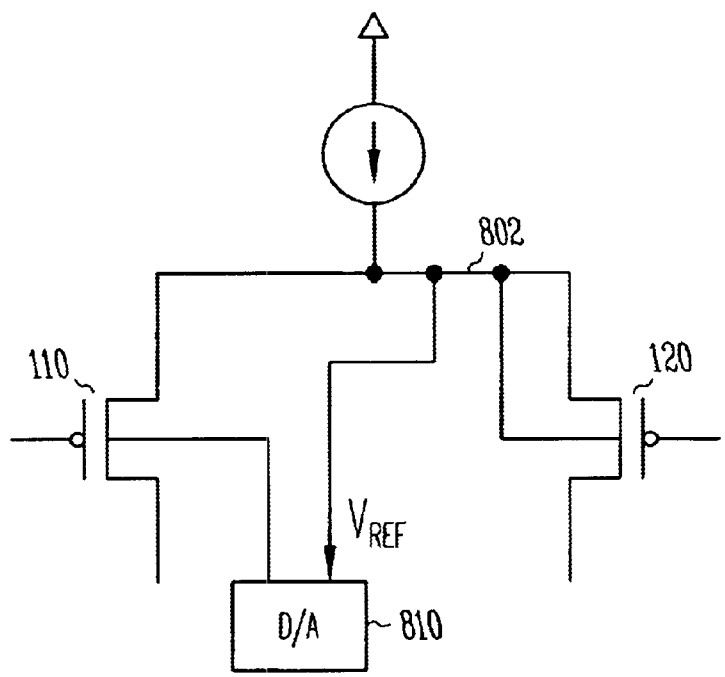

FIGS. 6–8 show portions of amplifier circuits with various body bias circuits. Portions of the circuits have intentionally been left out of FIGS. 6–8 for clarity. The portions shown include a differential pair of transistors and circuits useful, for providing body bias voltage(s). The circuits shown for providing body bias voltages can be any type of circuit capable of providing a bias voltage, including a charge pump or an analog-to-digital converter, examples of which are discussed above.

FIG. 6 shows transistor 110 having a body bias equal to the positive power supply voltage, and transistor 120 having a body bias voltage provided by body bias circuit 610. In some embodiments, body bias circuit 610 can only provide a body bias voltage that is equal to or less than the positive supply voltage, thereby limiting the offset between to the two body bias voltages to a single polarity. In other embodiments, body bias circuit 610 can provide a body bias voltage above the positive power supply voltage, thereby allowing the body bias voltage of transistor 120 to be above or below that of transistor 110.

FIG. 7 shows body bias circuit 710 providing body bias voltages to both transistors 110 and 120. In some embodiments, body bias circuit 710 changes the body bias voltage on both transistors in opposite directions simultaneously. In other embodiments, body bias circuit 710 changes the body bias voltages one at a time.

FIG. 8 shows a D/A converter 810 providing a body bias voltage to transistor 110, while transistor 120 has a body bias voltage referenced to the voltage at node 802, which is coupled to the source nodes of the differential pair. D/A 810 receives a reference voltage ($V_{REF}$) from node 802. This allows D/A 810 to provide a body bias voltage to transistor 110 that is referenced to the body bias voltage of transistor 120.

Figure 9:
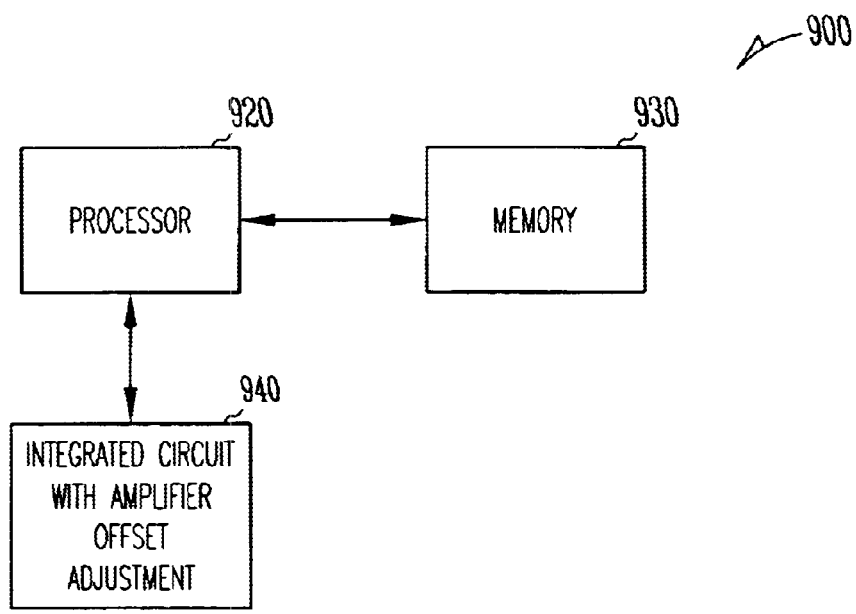
FIG. 9 shows a processing system.

FIG. 9 shows a processing system. Processing system 900 includes processor 920, memory 930, and integrated circuit 940. In some embodiments, processor 920, memory 930, and integrated circuit 940 are each separate integrated circuits. In some of these embodiments, processor 920 and memory 930 are arranged in a multi-chip module (MCM) and integrated circuit 940 is in a separate integrated circuit. In other embodiments, all of processing system 900 is implemented as a single integrated circuit. Processing system 900 can be a personal computer (PC), server, mainframe, handheld device, portable computer, set-top box, or any other system that includes a processor.

Memory 930 represents an article that includes a machine-accessible medium. For example, memory 930 represents any one or more of the following: a hard disk, a floppy disk, random access memory (RAM), read only memory (ROM), flash memory, CDROM, or any other type of article that includes a medium readable by a machine. Memory 930 can store instructions for performing the execution of the various method embodiments of the present invention.

Integrated circuit 940 includes an amplifier circuit with offset adjustment. For example, integrated circuit 940 can include any of the circuits described with reference to the previous figures. In operation, processor 920 accesses instructions from memory 930 and provides control information to integrated circuit 940 for offset adjustment. For example, processor 920 can cause an amplifier within integrated circuit 940 to enter offset adjust mode, and can also modify a digital control word or charge pump control signals to modify the body bias voltage on a transistor.

Integrated circuit 940 can be any integrated circuit capable of including an amplifier with offset adjustment. For example, integrated circuit 940 can be a processor such as a microprocessor, a digital signal processor, a microcontroller, or the like. Integrated circuit 940 can also be an integrated circuit other than a processor such as an application-specific integrated circuit (ASIC), a communications device, a memory controller, or a memory such as a dynamic random access memory (DRAM).

Figure 10:
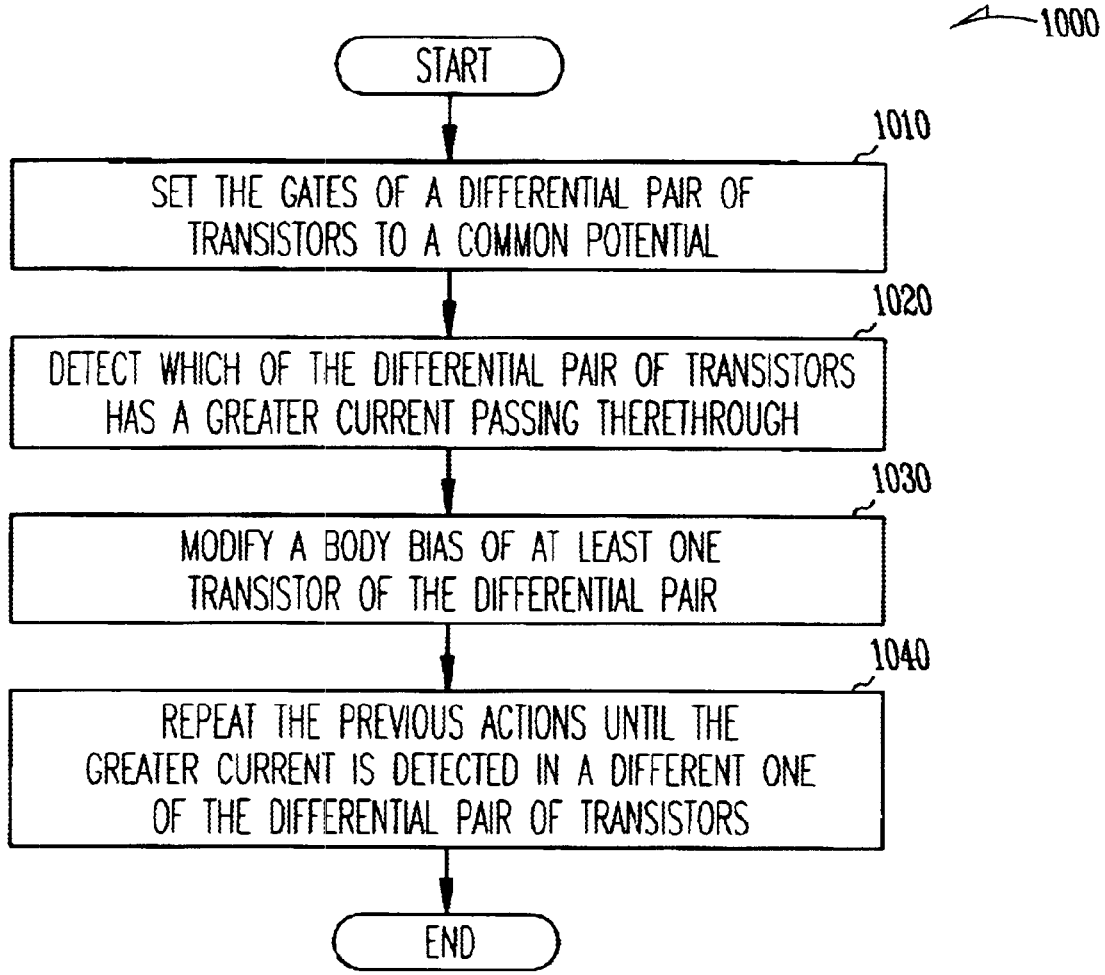
FIG. 10 shows a flowchart of a method of adjusting the offset of an amplifier.

FIG. 10 shows a flowchart of a method of adjusting the offset of an amplifier. At 1010, the gates of a differential pair of transistors are set to a common potential. In some embodiments, this is accomplished using an input select circuit such as input select circuit 340 (FIG. 3). In other embodiments, the gates are set to a common potential using different circuitry. At 1020, the method detects which of the differential pair of transistors has a greater current therethrough. In some embodiments, the currents are compared directly. In other embodiments, the currents are compared by comparing voltages that are produced from the currents.

At 1030, the body bias of at least one transistor of the differential pair is modified in response to the detection in 1020. In some embodiments, this is performed using a charge pump, and in other embodiments, the body bias is changed using a D/A converter. At 1040, the previous actions are repeated until the greater current is detected in a different one of the differential pair of transistors. This corresponds to point 230 as shown in FIG. 2.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit comprising:
   first and second transistors coupled as a differential pair, each of the first and second transistors having a gate, a source, a drain, and a body; and
   a capacitor coupled between the body and the source of the first transistor;
   wherein the body of the second transistor is coupled to the source of the second transistor.

2. The circuit of claim 1 further comprising a body bias circuit coupled to the body of the first transistor.

3. The circuit of claim 2 wherein the body bias circuit includes a charge pump.

4. The circuit of claim 3 wherein the charge pump includes a p-channel transistor and an n-channel transistor coupled in series.

5. The circuit of claim 2 wherein the body bias circuit includes a digital-to-analog converter.

6. The circuit of claim 2 further comprising:
   a comparator coupled to the drain of the first transistor and the drain of the second transistor; and
   a control circuit responsive to the comparator, wherein the body bias circuit is responsive to the control circuit.

7. The circuit of claim 2 further comprising a plurality of select transistors coupled to the gates of the first and second transistors, to conditionally couple the gates of the first and second transistors to a common node.

8. A differential amplifier circuit comprising:
   a current source;
   a differential pair of transistors coupled to the current source, the differential pair of transistors including a first transistor and a second transistor;
   a comparator to compare a differential output voltage of the differential pair of transistors; and
   a body bias circuit coupled between the comparator and a body of the first transistor, wherein the body bias circuit comprises a charge pump to modify charge on the body of the first transistor responsive to the comparator.

9. A differential amplifier circuit comprising:
   a current source;
   a differential pair of transistors coupled to the current source, the differential pair of transistors including a first transistor and a second transistor;
   a comparator to compare a differential output voltage of the differential pair of transistors; and
   a body bias circuit coupled between the comparator and a body of the first transistor, wherein the body bias circuit comprises a digital-to-analog converter to apply a bias voltage to the body of the first transistor responsive to the comparator.

10. A differential amplifier circuit comprising:
    a current source;
    a differential pair of transistors coupled to the current source, the differential pair of transistors including a first transistor and a second transistor;
    a comparator to compare a differential output voltage of the differential pair of transistors;
    a body bias circuit coupled between the comparator and a body of the first transistor; and two select transistors coupled in series between gate nodes of the differential pair of transistors to drive the gate nodes to a common voltage.

11. A differential amplifier circuit comprising:
    a current source;
    a differential pair of transistors coupled to the current source, the differential pair of transistors including a first transistor and a second transistor;
    a comparator to compare a differential output voltage of the differential pair of transistors; and
    a body bias circuit coupled between the comparator and a body of the first transistor, wherein:
      the first transistor includes a source node coupled to the current source and a drain node coupled to a first input node of the comparator; and
      the second transistor includes a body node and a source node coupled to the current source, and a drain node coupled to a second input node of the comparator.

12. The differential amplifier circuit of claim 11 further comprising a capacitor coupled between the source node and body of the first transistor.

13. An integrated circuit comprising:
    an amplifier having an input stage that includes a differential pair of transistors, the differential pair of transistors including a first transistor having a first body and a second transistor having a second body;

an offset detector coupled to the differential pair of transistors to detect an offset current; and a body bias circuit responsive to the offset detector to bias the first body;

wherein the body bias circuit includes:

a charge pump coupled to inject charge on the first body; and a control circuit responsive to the offset detector to influence operation of the charge pump.

14. The integrated circuit of claim 13 wherein the control circuit comprises a state machine.

15. The integrated circuit of claim 13 wherein the control circuit comprises a processor.

16. An integrated circuit comprising:

an amplifier having an input stage that includes a differential pair of transistors, the differential pair of transistors including a first transistor having a first body and a second transistor having a second body;

an offset detector coupled to the differential pair of transistors to detect an offset current; and a body bias circuit responsive to the offset detector to bias the first body;

wherein the integrated circuit is a circuit selected from the group comprising a processor, a memory, a memory controller, an application specific integrated circuit, and a communications device.

17. A method comprising:

setting gate nodes of a differential pair of transistors to a common potential;

detecting which of the differential pair of transistors has a greater current passing therethrough; and modifying a body bias of at least one transistor of the differential pair;

wherein detecting which of the differential pair of transistors has a greater current comprises comparing voltages present on drain nodes of each of the differential pair of transistors.

18. A method comprising:

setting gate nodes of a differential pair of transistors to a common potential;

detecting which of the differential pair of transistors has a greater current passing therethrough; and modifying a body bias of at least one transistor of the differential pair;

wherein modifying a body bias comprises causing a charge pump to inject charge on the body of the at least one transistor.

19. A method comprising:

setting gate nodes of a differential pair of transistors to a common potential;

detecting which of the differential pair of transistors has a greater current passing therethrough; and modifying a body bias of at least one transistor of the differential pair;

wherein modifying a body bias comprises modifying a digital word input to a digital-to-analog converter.

20. The method of claim 19 further comprising:

repeating the detecting and modifying actions until the greater current is detected in a different one of the differential pair of transistors.

21. The method of claim 20 wherein the method is periodically repeated to periodically reduce the offset current in the differential pair of transistors.

22. An article comprising a machine-readable medium with instructions encoded thereon, the instructions when executed operable to cause a computerized system to:

detect an amplifier offset by setting gate nodes of a differential pair of transistors to a common potential and detecting which of the differential pair of transistors has a greater current passing therethrough; and modify a body bias of at least one of the transistors in the differential pair of transistors;

wherein modifying a body bias comprises changing a digital word input to a digital-to-analog converter.

23. An article comprising a machine-readable medium with instructions encoded thereon, the instructions when executed operable to cause a computerized system to:

detect an amplifier offset by setting gate nodes of a differential pair of transistors to a common potential and detecting which of the differential pair of transistors has a greater current passing therethrough; and modify a body bias of at least one of the transistors in the differential pair of transistors;

wherein modifying a body bias comprises influencing a charge pump to inject charge on a body of the one transistor.

* * * * *